United States Patent [19]

Hsue

[11] Patent Number: 5,536,670

[45] Date of Patent: Jul. 16, 1996

[54] PROCESS FOR MAKING A BURIED BIT LINE MEMORY CELL

[75] Inventor: Chen-Chiu Hsue, Hsin-chu, Taiwan

[73] Assignee: United Microelectronics Corporation, Hsin-chu, Taiwan

[21] Appl. No.: 287,722

[22] Filed: Aug. 9, 1994

[51] Int. Cl.$^6$ ............................................. H01L 21/70
[52] U.S. Cl. ........................... 437/52; 437/48; 437/69
[58] Field of Search .................................. 437/52, 44, 69, 437/70, 72, 51, 48

[56] References Cited

U.S. PATENT DOCUMENTS

| | | | |
|---|---|---|---|
| 4,598,460 | 7/1986 | Owens et al. | 437/52 |
| 5,019,526 | 5/1991 | Yamane et al. | 437/69 |
| 5,104,829 | 4/1992 | Shida | 437/70 |
| 5,147,813 | 9/1992 | Woo | 437/52 |
| 5,173,438 | 12/1992 | Sandhu | 437/245 |
| 5,234,859 | 8/1993 | Mametani et al. | 437/52 |
| 5,346,842 | 9/1994 | Bergemont | 437/52 |
| 5,466,624 | 11/1995 | Ong et al. | 437/52 |

*Primary Examiner*—Tuan H. Nguyen
*Attorney, Agent, or Firm*—Meltzer, Lippe, Goldstein, et al.

[57] ABSTRACT

A buried bit line memory cell and fabrication process are disclosed. A plurality of exposed windows of a semiconductor material are formed which are separated by mesas. An oxide region is then formed in the vicinity of each exposed surface window. The formed oxide regions encroach under the mesas and therefore cover and area which is greater than the original windows. The mesas are then removed to expose a second set of narrow windows of the surface of the semiconductor material separated by the oxide regions. Impurities are then implanted or diffused into the substrate through the second set of narrow surface windows to form doped regions. The doped regions are delineated by the edges of the oxide regions and are therefore narrower than the width of the mesas. At least some of the doped regions form the buried bit lines of the memory cells.

9 Claims, 2 Drawing Sheets

PROCESS FOR MAKING A BURIED BIT LINE MEMORY CELL

FIELD OF THE INVENTION

The present invention relates to semiconductor fabrication, and in particular, to a method for making a buried bit line memory cell.

BACKGROUND OF THE INVENTION

The present invention is applicable to buried bit line memory cells such as DRAM, SRAM, ROM, PROM, EEPROM, PAL, PLA, etc., memory cells. The invention is illustrated herein for DRAM cells.

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 14. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. For example, in the fabrication of memory cell arrays, it is often desirable to minimize the cell width and the spacing between bit lines in order to increase the capacity of a given size array. The source and drain regions of a MOSFET of a memory cell formed by prior art photolithographic techniques are shown in simplified form in FIG. 2. The cell has a source bit line region 2 and a drain region 4 formed in a substrate 6. The minimum value of a source or drain region width x, or a channel distance c within a substrate 6, is nominally equal to the smallest width m of masking element 8, as limited by photolithographic technology, e.g. 0.65 μm. Moreover, the minimum value of channel distance c is further limited by punch-through considerations, between $n^+$ region 2 and $n^+$ region 4.

It is an object of the present invention to reduce cell width x to a value less than mask width m. It is a further object of the present invention to improve the punch-through characteristics of channel c, without increasing the size of mask width m.

SUMMARY OF THE INVENTION

These and other objects are achieved by the present invention which provides a buried bit line memory cell fabrication process. According to one embodiment, a plurality of exposed windows of a semiconductor material are formed which are separated by mesas. For example, an oxide layer may be formed on the semiconductor material and a $Si_3N_4$ layer may be formed on the oxide layer. The $Si_3N_4$ and oxide layers are then illustratively patterned using a photolithographic and etching process to form $Si_3N_4$-oxide mesas which separate the expose surface windows. An oxide region is then formed in the vicinity of each exposed surface window, using, for example, a LOCOS (local oxidation of silicon) process. This process forms oxide regions which encroach under the mesas and therefore cover and area which is greater than the original windows. As a result, the spacing between the oxide regions on the substrate surface is less than the dimensions of the mesas. The mesas are then removed to expose a second set of narrow windows of the surface of the semiconductor material separated by the oxide regions. Impurities are then implanted or diffused into the substrate through the second set of narrow surface windows to form doped regions. The doped regions are delineated by the edges of the oxide regions and are therefore narrower than the width of the mesas. At least some of the doped regions form the buried bit lines (sources) of the memory cells.

Thus, assuming that the dimensions of the mesas are limited only by the resolution of the photolithographic process used in their fabrication, it is possible to form buried bit line regions which are narrower than could be formed using ordinary photolithographic techniques.

According to another embodiment, the oxide regions formed in the vicinity of the windows have a curved cross-section. Thus, the formation of the oxides creates a curvature or scallop concave shape in the substrate between the doped drain and source regions. This curvature provides a longer effective length channel between doped drain and source regions, thereby improving the punch-through characteristics of the memory cell without increasing the lateral separation of the doped drain and source regions.

DETAILED DESCRIPTION OF THE INVENTION

Figure 3A:
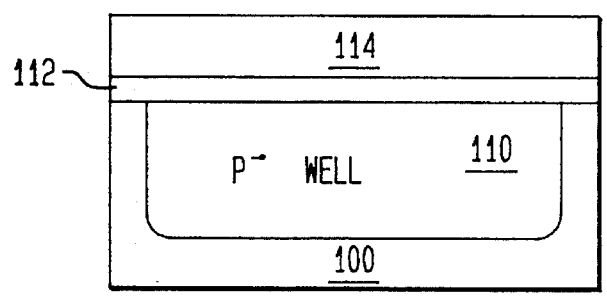
FIGS. 3a–3f illustrate a process, according to one embodiment of the present invention, for forming closely spaced buried bit line regions.
Figure 3B:
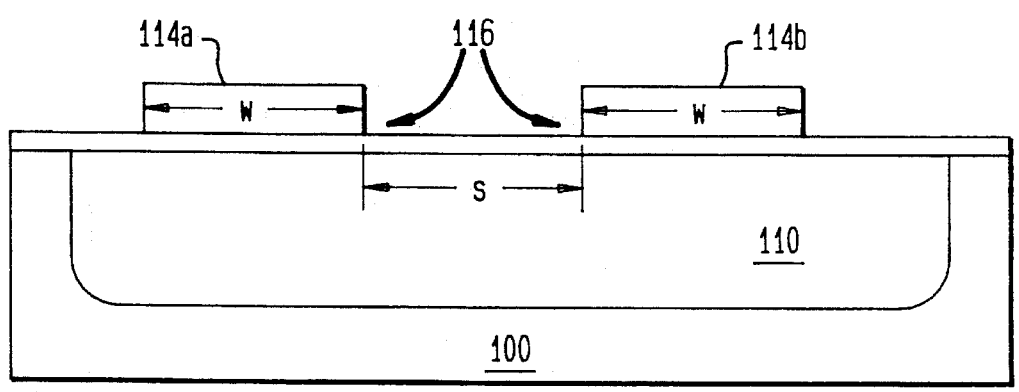

A process for fabricating a buried bit line memory cell according to one embodiment of the present invention is illustrated in FIGS. 3a–3f. Referring to FIG. 3a, a $p^-$well 110, with a doping concentration of $10^{16}$ cm$^{-3}$ is formed in a substrate 100 by diffusing or implanting Boron ions. An oxide layer 112 is then formed on the $p^-$well 110 which illustratively has a thickness of 400 Å. Thereafter, a $Si_3N_4$ layer 114 is formed on the oxide layer 112. As shown in FIG. 3b, the oxide layer 112 and $Si_3N_4$ layer 114 are patterned to form $Si_3N_4$-oxide mesas 114a and 114b. This is advantageously achieved by depositing a photoresist material on the $Si_3N_4$ layer 114, exposing the photoresist material through a mask to harden photoresist regions over the mesas 114a and 114b, removing the remaining photoresist material, and etching the exposed portions of the $Si_3N_4$ layer 114 using an etchant such as $SF_6$, The mesas 114a and 114b each have a width w.

By forming mesas 114a and 114b, a plurality of exposed windows 116 of the p-well surface 110 are also formed. The windows 116 are separated from each other by the mesas 114a and 114b. Each window 116 has a width s.

Figure 1:
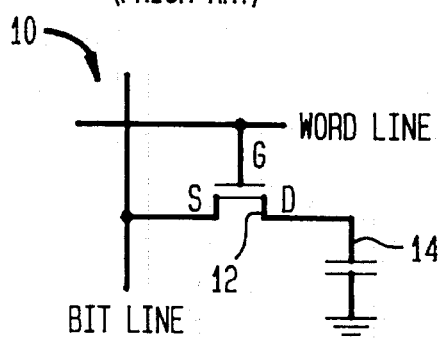
FIG. 1 shows a conventional DRAM cell.
Figure 3C:
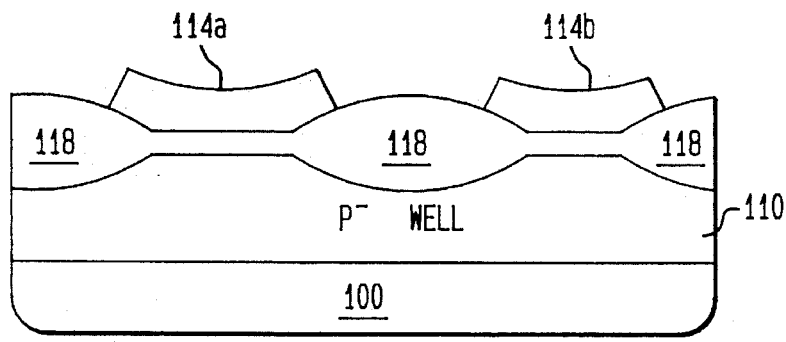
Figure 3D:
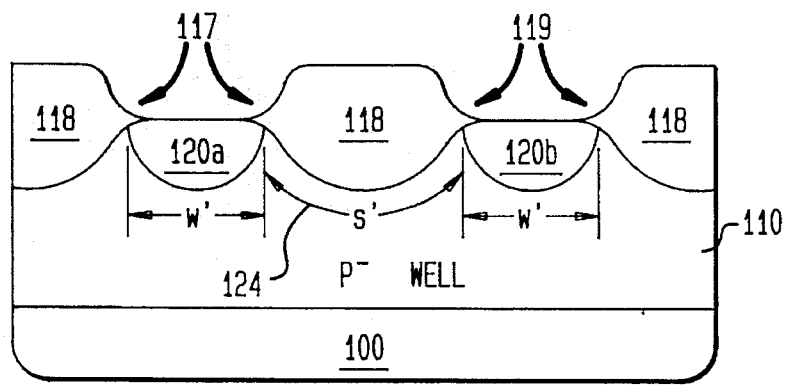

Referring to FIG. 3c, an oxide region 118 is formed in the vicinity of the window 116. Illustratively, this is achieved using a LOCOS process. In such a process, the exposed window 116 is exposed to heat, i.e., 900°–1000° in the presence of oxygen for a duration of approximately 120 minutes. As shown in FIG. 3c, field oxide regions 118 thus formed, encroach under, i.e., extend laterally beneath, the edges of the mesas 114a and 114b. Referring to FIG. 3d, the mesas 114a and 114b are then stripped from the substrate surface to expose windows 117 and 119 of the surface of the p⁻well 110 separated by the field oxide regions 118. The windows 117 and 119 each have a width w' which is approximately equal to w-0.3 μm. It is important to note that distance w' is smaller than width w of the mesas 114a and 114b in FIG. 3b, and smaller than the equivalent width x or m (FIG. 1) formed by ordinary photolithographic techniques.

Figure 2:
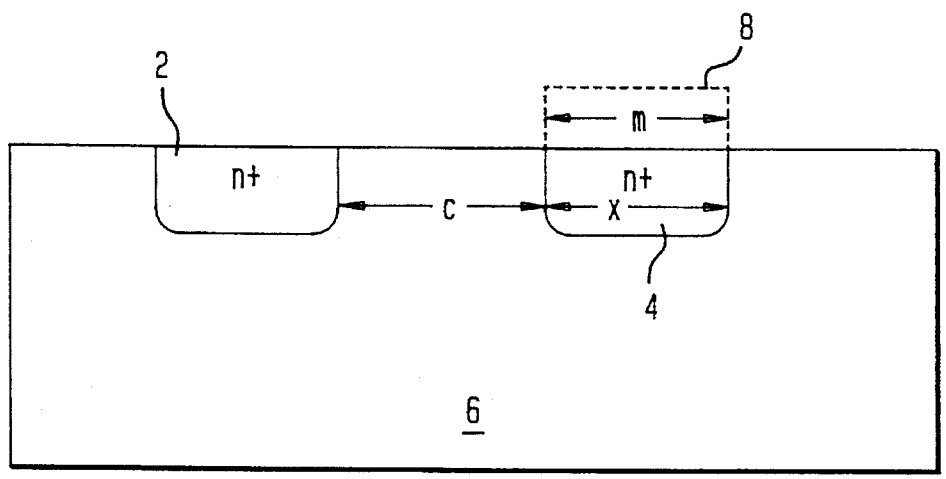
FIG. 2 illustrates a prior art bit line configuration formed from a traditional photolithographic process.

Thereafter, impurities, such as Arsenic are introduced into the p⁻well 110. The impurities are illustratively implanted at an energy of 80 keV into the p⁻well 110 through windows 117 and 119 to form doped regions 120a and 120b (illustratively n⁺). Illustratively at least one of the regions 120a and 120b is a buried bit line (source) region. (In the case of a DRAM cell, the other (drain) region may be connected to a capacitor.) In FIG. 3d, the curved shape of the field oxide regions 118 form channel regions 124 with a curved, concave cross-section between doped regions 120a and 120b, in the p⁻well 110. The curved channel 124 has an effective channel distance s' which is nominally equal to S+0.3 μm. The effective channel length s' is thus longer than the distance s in FIG. 3a and longer than the channel distance c in FIG. 2. As such, the curved channel 124 provides improved punch-through protection for the cell.

Figure 3E:
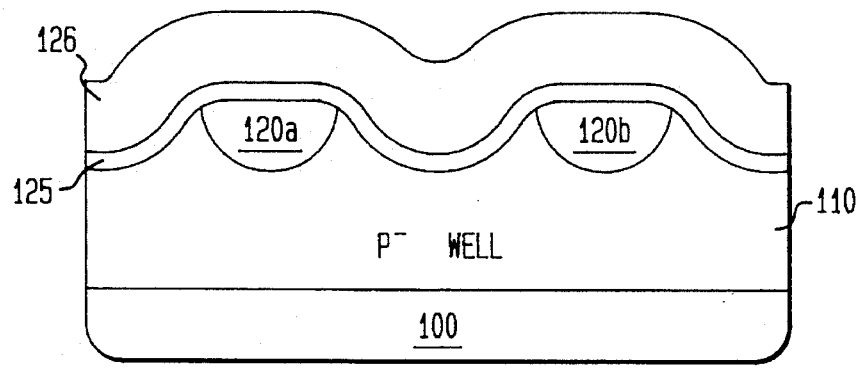

As shown in FIG. 3e, the field oxide regions 118 are removed. Then, a second oxide layer 125 (such as $SiO_2$) is formed on the surface of the p⁻well 110. Thereafter, a word line 126, e.g., a polycrystalline silicon word line, is formed on the second oxide layer 125.

Figure 3F:
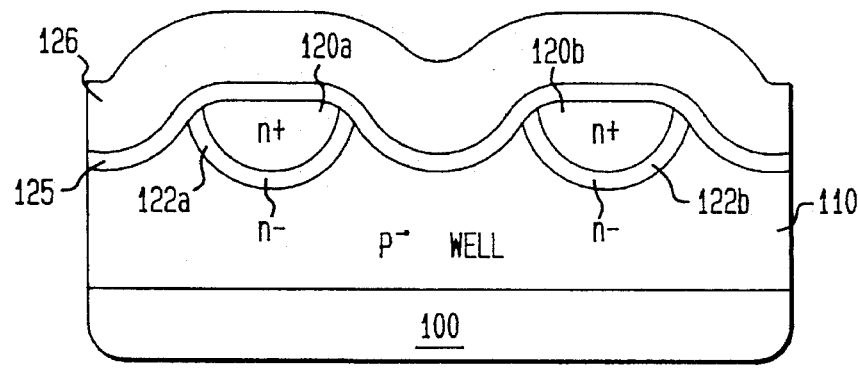

FIG. 3f shows another embodiment of the invention. In this embodiment, prior to implanting the n⁺ ions in step 3d, n⁻ ions such as Phosphorus are first implanted at an energy of 60 keV into the p⁻ well. Then, the n⁺ ions, such as Arsenic, are implanted but to a shallower penetration depth, e.g., using an energy of 80 keV. Illustratively, the n⁻ ions are implanted to a depth of 0.3 μm whereas the n⁺ ions are only implanted to a depth of 0.15 μm. Illustratively, this forms regions 122a and 122b with impurity concentrations of $10^{19}$ cm⁻³ and regions 120a and 120b with an impurity concentration of $10^{20}$ cm⁻³. The additional implanted regions 122a and 122b further enhance the punch-through resistance of the cell. The above discussion has been described with reference to certain embodiments. For instance, the invention has been illustrated for p-channel buried bit line memory cells but applies equally to n-channel buried bit line memory cells. Numerous other embodiments may be devised by those having ordinary skill in the art without departing from the spirit and scope of the following claims.

I claim:

1. A process for fabricating a semiconductor comprising the steps of:

forming a plurality of exposed windows of a surface of a semiconductor material separated by mesas, forming a plurality of oxide regions on said semiconductor material surface, including one oxide region formed at a vicinity of each of said windows, so that each of said oxide regions encroaches at least partly under mesas adjacent thereto, and forming a plurality of doped regions acting as buried bit lines within said semiconductor material, which doped regions are delineated by edges of said oxide regions, and are formed in openings resulting from removal of said mesas.

2. The process of claim 1 wherein said step of forming said windows comprises the steps of:

forming an oxide layer on said surface of said semiconductor material, forming a $Si_3N_4$ layer on said oxide layer, and patterning said oxide-and $Si_3N_4$ layers to form said windows.

3. The process of claim 2 wherein said step of forming said doped regions comprises the step of:

implanting impurities into said semiconductor material to form said doped regions.

4. The process of claim 3 wherein said step of implanting comprises:

in a first implanting step, implanting impurities to a first depth to form a first group of said doped regions, said first group being lightly doped, and in a second implanting step, implanting impurities to a second depth which is less than said first depth, to form a second group of said doped regions.

5. The process of claim 3 further comprising, after said step of forming said doped regions, the steps of:

removing said plurality of oxide regions, forming a second oxide layer on said semiconductor material surface, and forming a polycrystalline silicon word line on said second oxide layer.

6. The process of claim 1 wherein said doped regions have a smaller width than a width of said mesas.

7. The process of claim 6 wherein said oxide regions have a curved cross-sectional shape so that each of said oxide regions causes an adjacent channel portion of said semiconductor material to have a curved cross-section.

8. The process of claim 1 wherein said step of forming oxide regions comprises forming curved channels separating said doped regions to increase an effective channel length between adjacent ones of said doped regions without increasing a lateral distance separating said adjacent ones of said doped regions, so that a punch-through resistance of said semiconductor is improved.

9. The process of claim 1 further comprising:

forming a plurality of lightly doped regions, including one lightly doped region at a boundary of each of said doped regions, having a lower doping concentration than said doped regions.

* * * * *